US012500601B2

(12) United States Patent
Morgan et al.

(10) Patent No.: US 12,500,601 B2
(45) Date of Patent: Dec. 16, 2025

(54) VOLTAGE MONITORING OF SWITCHING DRIVERS

(71) Applicant: Cirrus Logic International Semiconductor Ltd., Edinburgh (GB)

(72) Inventors: Ross C. Morgan, Bathgate (GB); Michael Robinson, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 161 days.

(21) Appl. No.: 18/455,313

(22) Filed: Aug. 24, 2023

(65) Prior Publication Data

US 2025/0070795 A1    Feb. 27, 2025

(51) Int. Cl.
| H03M 3/00 | (2006.01) |
| H03M 1/06 | (2006.01) |
| H03M 1/46 | (2006.01) |
| H03M 3/04 | (2006.01) |
| H03K 17/082 | (2006.01) |

(52) U.S. Cl.
CPC ......... *H03M 3/042* (2013.01); *H03M 1/0626* (2013.01); *H03M 1/46* (2013.01); *H03K 17/082* (2013.01)

(58) Field of Classification Search
CPC ...... H03M 3/042; H03M 1/46; H03M 1/0626; H03K 17/082
USPC .......................... 341/143, 118, 120, 144, 155
See application file for complete search history.

(56) References Cited

U.S. PATENT DOCUMENTS

| 10,219,074 B2 | 2/2019 | Napoli et al. |
| 2009/0289708 A1 | 11/2009 | Beale et al. |
| 2010/0194413 A1 | 8/2010 | Dalbjoern |
| 2010/0321116 A1 | 12/2010 | Kim |
| 2011/0215867 A1* | 9/2011 | Sheen .................. H03F 3/2173 330/251 |
| 2017/0105068 A1 | 4/2017 | Lesso |
| 2018/0331660 A1 | 11/2018 | Hoyerby |

FOREIGN PATENT DOCUMENTS

GB    2562125 A    11/2018

OTHER PUBLICATIONS

Combined Search and Examination Report under Sections 17 and 18(3), UKIPO, Application No. GB2408789.2, dated Dec. 6, 2024.
Search Report under Section 17, UKIPO, Application No. GB2503729.2, mailed Oct. 2, 2025.

* cited by examiner

*Primary Examiner* — Peguy Jean Pierre
(74) *Attorney, Agent, or Firm* — Jackson Walker L.L.P.

(57) ABSTRACT

This application relates to methods and apparatus for voltage monitoring of switching drivers. A modulator is configured to receive a modulator input signal and to controlling switching of an output stage of the switching driver to generate a first drive signal. A voltage monitor is configured to receive a first digital signal tapped from the modulator and to generate an indication of output voltage of the first drive signal from the first digital signal by controllably applying an adjustment from the first digital signal to compensate for inaccuracy between the first digital signal and the output voltage. The adjustment is based on monitored operation of the modulator. In some cases the monitored operation may be clipping of the switching driver. In some cases the monitored operation may be a signal generated by the modulator that include a contribution from a feedback signal of output voltage.

20 Claims, 4 Drawing Sheets

VOLTAGE MONITORING OF SWITCHING DRIVERS

The field of representative embodiments of this disclosure relates to methods, apparatus and/or implementations concerning or relating to output voltage monitoring for switching driver circuits, and in particular to monitoring output voltage for switching driver or amplifier circuits as may be used to drive a transducer.

Many electronic devices include transducer driver circuitry for driving a transducer with a suitable driving signal, for instance for driving an audio output transducer of the host device or a connected accessory, with an audio driving signal.

In some applications, the driver circuitry may include a switching driver, e.g. a class-D amplifier output stage or the like, for generating the driving signal. Switching drivers, sometimes referred to as switched-mode drivers or switched-mode amplifiers, can be relatively power efficient and thus can be advantageously used in some applications. A switching driver generally operates to switch an output node between different switching voltages, with a duty cycle that provides a desired average output voltage, over the course of one or more switching cycles, for the drive signal.

In some cases, the switching driver may operate to receive defined supply voltages and switch the output node(s) between the received supply voltages. In some implementations, however, the switching driver may include some circuitry for generating additional or alternative voltages to be used as switching voltages, for instance inductor-based voltage boosting where a boosted voltage can be generated from the supply voltages and used, in at least some driver modes of operation, as a switching voltage. Recently, switching drivers have been proposed that use capacitive voltage generation to provide additional or alternative switching voltages, e.g. generated using a flying capacitor such as via a charge pump or the like.

In general, it may be desirable to be able to monitor the output voltage of the switching driver for various reasons, e.g. for detecting and/or avoiding signal clipping or otherwise controlling operation of the switching driver and/or for protection of the transducer.

Typically, the output voltage of a switching driver or amplifier may be monitored by a voltage monitor comprising a suitable analog front end (AFE) and digital-to-analog converter (ADC). Such an arrangement can, in many implementations, provide suitable monitoring of the output voltage, although generally this monitoring circuitry may require some trimming to account for process variations during manufacture, which requires testing and calibration time following manufacture. In addition, the AFE and ADC can be relatively large in terms of circuit area and, in general, there is a trend to smaller circuit footprints, where possible, for size and cost reasons. The power requirements for the AFE and ADC also impact on the power efficiency of the switching driver circuit.

Embodiments of the present disclosure relate to methods and apparatus for voltage monitoring in switching drivers that mitigate at least some of the above-mentioned issues.

According to an aspect of the disclosure there is provided a circuit comprising a modulator configured to receive a modulator input signal and to generate at least one control signal based on the modulator input signal for controlling switching of an output stage of a switching driver to generate a first drive signal. The circuit also comprises a voltage monitor configured to generate an indication of output voltage of the first drive signal. The voltage monitor is configured to receive a first digital signal tapped from the modulator and to generate the indication of output voltage of the first drive signal from the first digital signal by controllably applying an adjustment from the first digital signal to compensate for inaccuracy between the first digital signal and the output voltage, wherein the adjustment is based on monitored operation of the modulator.

In some examples, the first digital signal may be the modulator input signal.

In some examples, the monitored operation may comprise operation of the modulator in a clipping condition and the modulator is configured to output at least one indication of clipping to the voltage monitor. Operation of the modulator in a clipping condition may comprise at least one of: clipping of an analog integrator of the modulator, clipping of a digital filter of the modulator; current limiting of an input current to the output stage being applied; current limiting of an output current from the output stage being applied; and a limit of duty-cycle of the output stage being applied. The voltage monitor may be configured to use the first digital signal to provide the indication of output voltage of the first drive signal when the switching driver is not operating in a clipping condition and to generate a synthesised signal to provide the indication of output voltage of the first drive signal when the switching driver is not operating in a clipping condition. The voltage monitor may be configured to generate the synthesised signal by holding a value of the first digital signal from a time at which the indication of clipping is received.

In some examples, the modulator may be a closed-loop modulator configured to receive a feedback signal from a first driver output node of the output stage and the indication of output voltage of the first drive signal generated by the voltage monitor may be an indication of output voltage at the first driver output node.

In some examples, the modulator may be a closed-loop modulator configured to receive a feedback signal from a first driver output node of the output stage and the voltage monitor may be configured to process the first digital signal according to a defined transfer characteristic for a downstream path from the first driver output node to a load such that the indication of output voltage of the first drive signal generated by the voltage monitor is an indication of output voltage at the load.

In some examples, the modulator may be a closed-loop modulator configured to receive a feedback signal from a monitoring point of a downstream path from the output stage to a load and the indication of output voltage of the first drive signal generated by the voltage monitor may be an indication of output voltage at the monitoring point. In which case, in some examples the monitored operation of the modulator may comprise monitoring a second signal generated by the modulator which includes a contribution from the modulator input signal and a contribution from the feedback signal. The voltage monitor may be configured to receive the second signal and voltage monitor may be configured to use the second signal to process the first digital signal to recover the feedback signal. The second signal may be a digital signal. In some examples, the modulator may comprise a digital-to-analog converter for receiving the modulator input signal and converting it to analog, a combiner for combining the analog modulator input signal with the feedback signal and a filter arrangement configured to receive the analog output from the combiner, apply filtering and output a filtered digital signal. The filter arrangement may comprise a analogue-to-digital converter and the second signal may be tapped from the output of the analogue-to-digital converter.

The filter arrangement may comprise an analogue integrator between the combiner and the analogue-to-digital converter and the voltage monitor may be configured to receive and differentiate the second signal and combine the differentiated second signal with the first signal to provide the indication of output voltage of the first drive signal.

The modulator may comprise at least one of: an analogue integrator configured as a wrapping integrator; and a digital integrator configured as a wrapping integrator.

In some examples, the circuit may further comprise digital processing circuitry upstream of the switching driver configured to provide the modulator input signal to the modulator. The digital processing circuitry may be configured to receive the indication of output voltage of the first drive signal from the voltage monitor for use in at least one control process. The digital processing circuitry may be configured to receive the indication of output voltage of the first drive signal and to use it, together with an indication of output current from the output stage, for thermal protection of a load driven by the first drive signal.

The circuit may be implemented as part of an integrated circuit. In some cases the output stage may be formed as part of the integrated circuit but in some implementations, the integrated circuit may be configured to output the control signal(s) to an external, i.e. off-chip, output stage.

In another aspect, there is provided a driver apparatus for driving a load comprising a switching driver comprising an output stage configured to switch a first driver output node between different switching voltages to generate a first drive signal for driving the load at the first driver output node and a modulator configured to receive a modulator input signal and to control switching of the output stage based on the modulator input signal. A voltage monitor is configured to generate an indication of output voltage of the first drive signal, wherein the voltage monitor is configured to receive a first digital signal indicative of the modulator input signal and a second digital signal indicative of modulator operation and to adjust the first digital signal based on the second digital signal to generate said indication of output voltage of the first drive signal.

In a further aspect, there is provided a circuit comprising a modulator configured to receive a modulator input signal and to generate at least one control signal based on the modulator input signal for controlling switching of an output stage of a switching driver to generate a first drive signal. The circuit also comprises a voltage monitor configured to generate an indication of output voltage of the first drive signal. The voltage monitor is configured to receive a first digital signal indicative of the modulator input signal and an indication of clipping of the modulator and to use the first digital signal to provide the indication of output voltage of the first drive signal when the switching driver is not clipping and to generate a synthesised signal to provide the indication of output voltage of the first drive signal when the switching driver is clipping.

In a yet further aspect, there is provided a circuit comprising a modulator configured to receive a modulator input signal and to generate at least one control signal based on the modulator input signal for controlling switching of an output stage of a switching driver to generate a first drive signal, wherein the modulator is a closed-loop modulator configured to receive a feedback signal from a monitoring point of a downstream path from the output stage to the load. A voltage monitor is configured to generate an indication of output voltage of the first drive signal, wherein the voltage monitor is configured to receive a first digital signal indicative of the modulator input signal and a second digital signal indicative of the modulator input signal combined with the feedback signal and to process the first and second digital signals to provide an indication of the feedback signal to provide said indication of output voltage of the first drive signal.

In another aspect there is provided a circuit comprising: a closed-loop modulator configured to generate at least one control signal for controlling switching of an output stage of a switching driver to generate a first drive signal; and a voltage monitor configured to receive one or more signals derived from the closed-loop modulator and to provide an indication of an output voltage from the output stage of the switching driver based on said received one or more signals.

It should be noted that, unless expressly indicated to the contrary herein or otherwise clearly incompatible, then any feature described herein may be implemented in combination with any one or more other described features.

For a better understanding of examples of the present disclosure, and to show more clearly how the examples may be carried into effect, reference will now be made, by way of example only, to the following drawings in which.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the disclosure relate to output voltage monitoring for switching drivers, e.g. switched mode amplifiers such as class-D amplifiers or the like.

Figure 1:
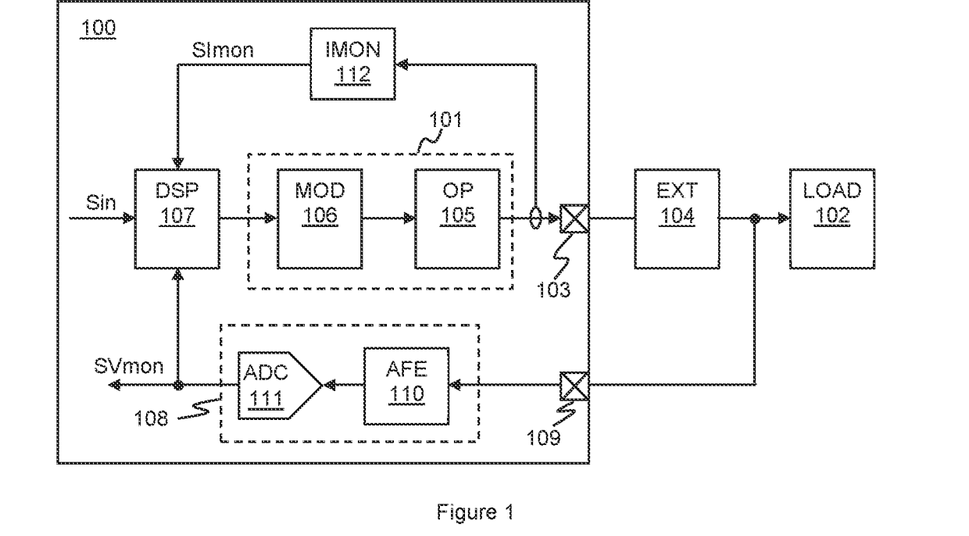
FIG. 1 illustrates one conventional example of a switching driver apparatus with output voltage monitoring.

FIG. 1 illustrates one conventional example of a driver apparatus 100 having a switching driver 101 for driving a transducer load 102 based on an input signal Sin. In some applications the transducer load 102 could be an audio or acoustic output transducer, such as a loudspeaker of a host device of the driver apparatus or a speaker of an accessory device removably connected to the host device, or may be a haptic output transducer, such as linear resonant actuator or the like. In general a variety of different types of transducer may be driven by a suitable switching driver.

The driver apparatus 100 may typically be implemented as an integrated circuit (IC), with the load 102 coupled to at least one output terminal 103 of the driver apparatus via an external, i.e. off-chip, path 104 that may, for instance, be partly implemented by a path on a PCB (printed circuit board) and which may, in some cases, comprise or be connected to components such as ferrite beads or diodes for ESD (electrostatic discharge) protection or the like.

The switching driver 101 is configured to selectively switch the output terminal between different voltages, referred to herein as switching voltages, with a controlled duty cycle so as to generate a suitable output voltage (on average over the course of one or more switching cycles) for driving the load based on the input signal Sin. The switching driver 101 comprises an output stage 105, which may generally comprise a network of switches that can be selectively switched between different switch states so as to couple the different switching voltages to the output terminal 103. In some applications, at least one of the switching voltages may, in at least one mode of operation, be a voltage which is generated by a voltage generator (not illustrated), e.g. a boosted voltage generated by an inductive or capacitive boost circuit. In some applications, the switching driver 101 may be selectively operable in different modes, in which at least one of the switching voltages used is different in the different modes, and may selectively operate in a selected mode to provide the output signal in a given output voltage range.

The output stage may comprise first and second switches for selectively connecting the output terminal 103 to either of two different switching voltages respectively, but other arrangements of switching driver, which may comprise a more complex network of switches for selectively switching the output terminal between selected switching voltages, may be implemented. A modulator 106 is configured to control switching of the output stage 105 between selected switch states with a controlled duty-cycle based on the input signal Sin. The modulator 106 may typically be implemented as a closed-loop modulator and thus may receive a feedback signal (not illustrated in FIG. 1) indicative of the output from the switching driver 101 as will be discussed in more detail below. The modulator 106 may comprise a PWM modulator, e.g. a sigma-delta PWM modulator as would be understood by one skilled in the art.

The driver apparatus 100 may also comprise some processing circuitry 107 for processing of the input signal Sin upstream of the switching driver 101, which in the example of FIG. 1 is digital signal processing (DSP) circuitry.

The driver apparatus 100 of FIG. 1 also comprises some voltage monitoring circuitry 108 for monitoring the output voltage to the load 102. In the example of FIG. 1, the output voltage is monitored at a monitoring point near to the load 102 itself so as to monitor the actual voltage at the load and thus take account of any effect on the output voltage of the external path 104 e.g. the effect of a PCB trace and any components forming part of or coupled to the external path. The driver apparatus 100 may thus comprise a voltage monitor terminal 109 for receiving the voltage from the monitoring point. The voltage monitoring circuitry 108 comprises an analog front end (AFE) 110 for conditioning of the received voltage, which may be a relatively high voltage signal suitable for driving a transducer, followed by a suitable analog-to-digital converter (ADC) 111, which will generally be a relatively high-resolution ADC, for generating a signal SVmon indicative of the output voltage. This signal SVmon indicative of the output voltage may be provided to the DSP 107 for processing, e.g. as part of controlling operation of the driver apparatus 100 and/or for implementing some protection for the load, e.g. to prevent thermal overload or over-driving of the load 102. For instance, in some applications, the DSP 107 may use the indication SVmon of the output voltage together with an indication SImon of an output current from the switching driver to the load which is monitored by current sensing block 112, to determine an indication of load resistance. Such an indication of load resistance may be useful for thermal protection of the load as the load resistance for a loudspeaker or the like has a dependence on temperature.

Additionally or alternatively the signal SVmon may be output to some other circuitry of the driver apparatus 100 or some external processor/controller for additional or alternative monitoring and/or control.

Such an arrangement can satisfactorily monitor the output voltage, but the circuit area required for the AFE 110 and ADC 111 of the voltage monitoring circuitry 108 may be relatively significant, which can add to the cost of the driver apparatus 100. In addition, the power consumed by the AFE 110 and ADC 111 can impact the overall power efficiency of the driver apparatus 100. The voltage monitoring circuitry 108 may also, in some cases, require some trimming to identify and correct for any PVT (process-voltage-temperature) variations, which will require testing time following fabrication and may require some one-time programmable (OTP) memory or other on-chip storage to store the relevant trim settings.

Note that FIG. 1 illustrates just one output terminal 103. In some cases, the driver apparatus 100 may be implemented in a single-ended driver configuration and the voltage at the output terminal 103 may be modulated between the relevant switching voltages with a controlled duty-cycle by the switching driver 101 to generate a suitable output voltage for driving the load 102, with the other side of the load being connected, in use, to a defined DC voltage that doesn't vary with the input signal, e.g. ground. Alternatively, the driver apparatus 100 may be implemented in a bridge-tied-load (BTL) driver configuration, in which the load 102 will be connected between first and second output terminals, each of which is modulated between selected switching voltages with respective duty-cycles based on the input signal so as to develop the desired drive voltage across the load. For a BTL configuration, the voltage monitoring circuitry 108 may be implemented with a differential AFE 110.

Embodiments of the present disclosure relate to methods and apparatus for monitoring output voltages of switching drivers which are based on monitoring a first signal which is tapped from a signal path upstream of the output stage of the switching driver. In particular, embodiments may advantageously be implemented in which an indication of output voltage is determined by monitoring a first digital signal tapped from the signal path upstream of the output stage of the switching driver, e.g. from the modulator. By monitoring a first signal, in particular a first digital signal tapped from the signal path before the output stage, the need for a separate AFE and ADC for monitoring the output voltage can be avoided.

In general, as the modulator 106 operates to control the output stage to generate the output voltage based on the signal as processed in the forward signal path, a first signal tapped from the forward signal path can be used as an indication of the output voltage at the output node 103. For instance, consider that the first signal is the digital signal which is input to the modulator 106. This signal defines the desired output voltage, or in other words the voltage demand of the switching driver, and thus can be used as the basis of an indication of the output voltage. However, in practice, there may be some instances, in use of the switching driver, where the relationship between the first signal and output voltage varies.

For instance, there may be instances where the switching driver 101 is not able to provide the output voltage demanded by the input to the switching driver 101. This may be due, for example, due to a current or voltage limit being reached, and appropriate limiting being applied and/or may be due to saturation of one of the components of the switching driver. For instance, a current limit may be applied to an input current to the switching driver 101 from a power supply to avoid the switching driver 101 drawing an overcurrent and/or some current limiting may be applied upstream, e.g. to limit current draw from a battery. Additionally or alternatively, an output current from the switching driver 101 may be limited. Such current limiting may prevent the switching driver 101 from meeting the voltage demand. Likewise saturation of a component, e.g. a filter of the modulator, can result in limiting of the output voltage. For any of these events, the switching driver 101 may be operating in a clipping condition where the output voltage is clipped and a first signal, which is tapped from the input for the switching driver, may not accurately indicate the resultant output voltage.

In addition, depending on the configuration of the modulator 106, and, in particular, for a closed loop modulator, the point at which the feedback signal for the modulator is obtained, the transfer characteristic of the external path 104 can impact on the output voltage at the actual load itself and in some cases the transfer characteristic may vary with operating conditions, e.g. such as temperature.

For at least these reasons, the monitored first signal may, at times, not be an accurate indication of the output voltage it is wished to monitor. At least some embodiments of the present disclosure thus use a first signal tapped from a signal path upstream of the output stage as the basis for an indication of the output voltage and apply at least some variable adjustment to the first signal, so as to provide the indication of the output voltage. The variable adjustment may compensate for one or more of the sources of inaccuracy described above and may be based on monitored operation of the switching driver, e.g. of the modulator.

Embodiments may be implemented in different ways, in particular depending on where the feedback for a closed loop modulator is obtained.

Figure 2:
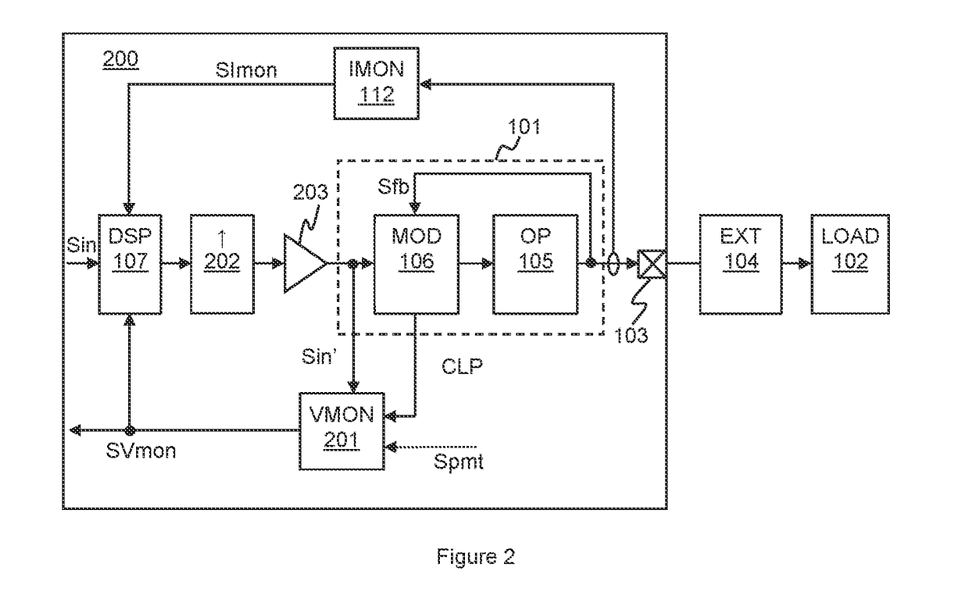
FIG. 2 illustrates an example of a switching driver with output voltage monitoring according to an embodiment.

FIG. 2 illustrates an embodiment of a driver apparatus 200 in which similar components as discussed previously are identified by the same reference numerals. In the example of FIG. 2 the modulator 106 is implemented as a closed loop modulator configured to receive a feedback signal Sfb from the output from the output stage 105. In this case, the feedback path may be implemented entirely as part of an integrated circuit with the driver apparatus 200 and all the components within the feedback loop of the modulator 106 will thus be on-chip with known characteristics. This can ease design constraints for the modulator control loop for stability and performance and avoids the need for an IC terminal to receive the feedback from off-chip.

To provide monitoring of the output voltage, the driver apparatus 200 of FIG. 2 comprises a voltage monitor 201 which is configured to receive a first digital signal from the forward signal path, which, in this example, is the signal Sin' which is input to the modulator 106. FIG. 2 illustrates that the input Sin' to the modulator 106 may be the signal which is output from the DSP 107 which is subsequently interpolated by interpolator 202 to increase the sample rate and processed by path gain block 203 to apply a suitable digital gain, as will be understood by one skilled in the art. The voltage monitor 201 is also configured to receive at least one indication CLP from the modulator 106 which is indicative of clipping. The voltage monitor 201 is configured to use the first digital signal and the indication of any clipping to provide an indication SVmon of the output voltage.

When there is no indication of any clipping, i.e. the switching driver 101 is operating normally within acceptable limits, the first digital signal Sin', which is indicative of the demanded output voltage, may be used to provide an indication of the output voltage from the output stage, taking into account the signal transfer function of the switching driver itself. Generally the signal transfer function of the switching driver is designed to be spectrally flat for the signal band of interest, but, if needed, the impact of any signal dependent gain error can be compensated for by the voltage monitor 201.

Note that in the embodiment of FIG. 2, the feedback signal Sfb for the modulator 106 is tapped from the output of the output stage and thus the action of the modulator control loop is to try to ensure that this voltage is equal to the demanded voltage. The impact of any downstream components of the external path 104 is not part of the control loop and thus may affect the output voltage at the load 102 itself. In some implementations the voltage monitor 201 may simply provide the output signal SVmon as an indication of the output voltage at the output stage 105 and leave it to any downstream processing to make any necessary adjustments to reflect the actual voltage at the load if necessary.

However, in some embodiments, the voltage monitor 201 may be configured to provide the output SVmon as an indication of the output voltage which is expected at the load, in which case the voltage monitor 201 may process the first digital signal according to a transfer characteristic that represents the effect of the external path 104. This transfer characteristic may be determined in some characterisation process following device manufacture and/or based on a modelled characteristic for a given use case. In some cases, the transfer characteristic of the external path may vary with operating conditions, e.g. such as temperature or the like, and the voltage monitor 201 may thus be configured to receive an indication Spmt of one or more operating parameters, e.g. temperature, and adjust the transfer characteristic accordingly. The voltage monitor 201 may therefore effectively apply an adjustment to the first signal Sin' to take into account the effect of the downstream components on the output voltage at the load 102.

If clipping of the switching driver 101 occurs, then the switching driver 101 is unable to provide the output voltage demanded by the signal Sin', in which case the signal Sin' will no longer be an accurate representation of the output voltage. As will be understood by one skilled in the art, when clipping occurs, the operation of the switching driver has reached some limit and is unable to further increase the magnitude of the output voltage. The switching driver 101 will, in such a case, operate in a limited or clipped fashion, which may, in at least some cases, result in the output voltage being generally maintained at the limited level until the clipping condition clears. In the embodiment of FIG. 2, the operation of the switching driver 101 provides an indication of a clipping condition to the voltage monitor 201. There are various ways in which an indication of clipping may be provided, as will be described in more detail below, and one skilled in the art will understand that an indication of clipping may be implemented in some conventional switching drivers as part of the control of the switching driver. In the embodiment of FIG. 2, however, the indication of clipping is used by the voltage monitor 201 to provide an adjustment to the first digital signal Sin' so as to provide the indication SVmon of the output voltage. In general, when the indication of clipping indicates that the switching driver 101 is clipping, the voltage monitor 201 may synthesise the signal SVmon based on the relevant operating conditions. In some cases, the voltage monitor 201 may maintain the indication SVmon of the output voltage at its previous level until the clipping condition clears.

Figure 3:
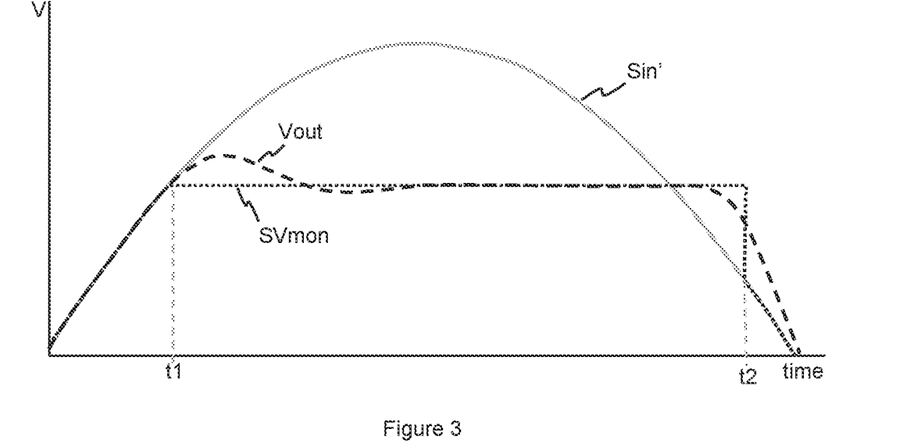
FIG. 3 illustrates synthesising the output voltage during a clipping event.

FIG. 3 illustrates this approach. FIG. 3 illustrates an example of the first digital signal Sin', shown in terms of the voltage demand over time. Note the example of FIG. 3 shows just part of an example input signal which includes a signal peak and it will be understood that voltage range in the plot of FIG. 3 is focused on the signal peak and does not, therefore, represent the full signal excursion range of a typical signal. FIG. 3 also illustrates the resultant output voltage Vout (in this example being the output voltage at the output of the output stage 105). In FIG. 3 the first digital signal Sin' is illustrated as being delayed by an appropriate amount to match the propagation delay of the switching driver 101 for ease of comparison. FIG. 3 also illustrates the indication SVmon of output voltage which is generated by the voltage monitor 201 (in this example ignoring any adjustment applied to account for the external path 104).

It can be seen that initially, before a time t1, the switching driver 101 is operating within acceptable limits and the output voltage Vout thus closely matches the voltage demand of the first digital signal Sin'. Before the time t1, the voltage monitor 201 thus uses the first digital signal Sin' as the indication SVmon of the output voltage. At the time t1, the switching driver 101 enters a clipping condition, for instance as a result of a relevant current limit being reached and a clipping flag is raised. The first digital signal Sin' continues to rise, but as the voltage monitor 201 has received the indication that the switching driver 101 is clipping, the voltage monitor 201 synthesises the SVmon output from the time t1 and, in this example, holds the value of SVmon from the time t1. In this illustrated example, the first signal Sin' peaks and then decreases and the clipping condition clears at a time t2. The voltage monitor 201, in this example, thus maintains the SVmon value between times t1 and t2, and then, when the clipping condition clears at time t2, resumes use of the first digital signal Sin' as the indication SVmon of the output voltage. FIG. 3 illustrates that the indication SVmon of output voltage generated in this way matches closely the actual output voltage Vout, although there are some minor transients in the actual output voltage on entry into and on exit from the clip state. However, the signal SVmon generated by the voltage monitor 201 in this way can be used satisfactorily as an indication of the output voltage, in particular because clipping events may tend to be transitory in nature. It will be appreciated that the driver apparatus 100 will typically be operated in a manner to prevent clipping of the switching driver 101 and, for example, the DSP 107 may be implemented to apply gain control or compression to the input signal Sin upstream of the switching driver 101 to generally avoid clipping of the switching driver. In operation, there may still be cases where clipping does occur, but such clipping events will generally be transitory events.

In some embodiments, the voltage monitor 201 is thus configured to hold the then present value of the first digital signal, e.g. the present value of Sin', as the value of SVmon when a clipping event occurs and to maintain that value until the clipping event clears. In other embodiments, the voltage monitor 201 could be implemented to take one or more other operating parameters into account, such as an input supply voltage, and model any consequent change in the output voltage during the clipping condition and output the modelled value.

Figure 4:
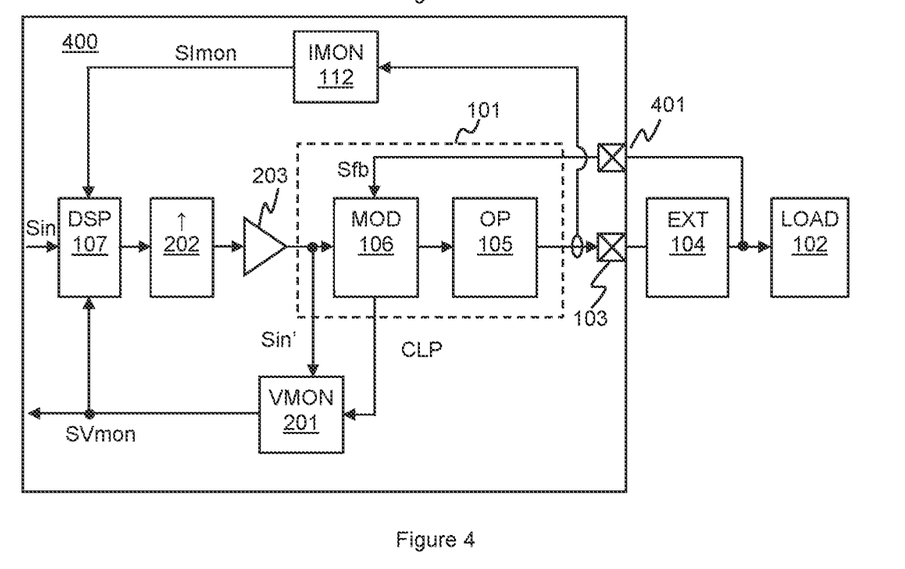
FIG. 4 illustrates another example of a switching driver with output voltage monitoring according to an embodiment.

In the embodiment of FIG. 2, the feedback signal Sfb for the modulator 106 is tapped from the output of the output stage 105. FIG. 4 illustrates an alternative embodiment of a driver apparatus 400, where the same components are identified by the same reference numerals, and in which the feedback signal Sfb for the modulator 106 is obtained from the external path near to the load 102. This does require the presence of a terminal 401 for receiving this external feedback signal. In addition, providing external feedback in this way requires careful design to avoid injecting noise into the modulator signal path. However, with suitable design, taking feedback from near the load 102 has the advantage that the impact of the external path 104 is within the control loop of the modulator, which thus acts to try to ensure that the voltage at the monitoring point near the load 102 matches the voltage demand of the signal Sin'.

The voltage monitor 201 may operate in the same way as discussed with reference to FIG. 2 and may use the first digital signal Sin' as the indication SVmon of the output voltage when the switching driver 101 is not in a clipping state and may synthesise the SVmon signal when the switching driver 101 is in a clipping state, e.g. by holding the value of the SVmon signal. In this embodiment, however, as the external path 104 is within the control loop of the modulator 106, there may be no need to separately account for the impact of the external path 104 and the output SVmon is indicative of the output voltage at the feedback point near to the load.

Figure 5:
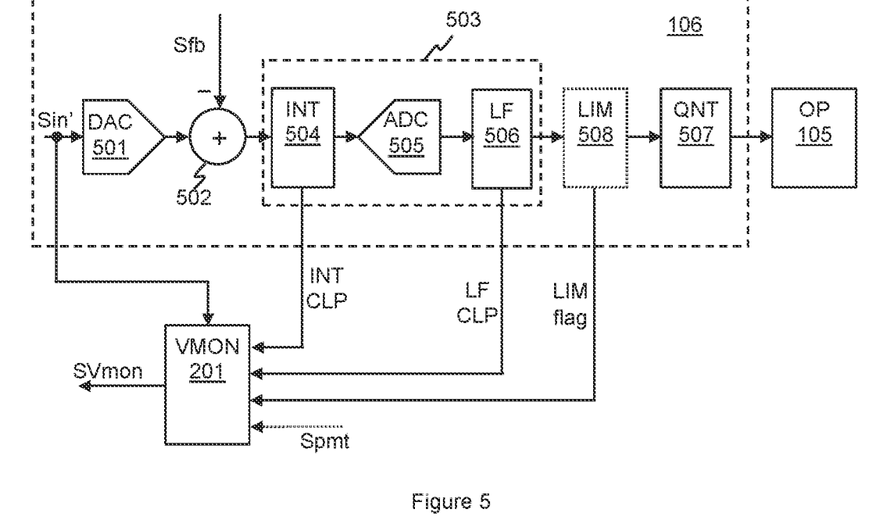
FIG. 5 illustrates one example of a modulator with voltage monitoring for use in the embodiments of FIG. 2 or 4.

There are various ways in which clipping of the switching driver 101 may occur and/or be detected. FIG. 5 illustrates one example of a modulator 106 suitable for use as a modulator in an embodiment of the present disclosure together with the voltage monitor 201.

FIG. 5 illustrates that the modulator 106 comprises a DAC 501 for receiving the digital signal sin' and converting it to a corresponding analog signal for combination with the feedback signal Sfb. The feedback signal Sfb may be an analog feedback signal from the output of the output stage 105 as discussed with reference to FIG. 2 or an external feedback signal tapped from near the load as discussed with reference to FIG. 4. In the example of FIG. 5, a combiner 502 subtracts the feedback signal from the input signal so as to provide an error signal indicative of the error between the voltage demand of the input signal; Sin' and the feedback signal, i.e. the monitored output voltage. In the example modulator 106 of FIG. 5, this error signal is input to a hybrid filter arrangement 503, which receives the analog error signal and outputs a filtered digital signal. In the example of FIG. 5, the hybrid filter arrangement 503 comprises an analog integrator 504, ADC 505 and digital loop filter 506 (which may comprise one or more further integrators). It will be understood, however, that it is just one possible filter arrangement and other arrangements may be implemented. The output from the hybrid filter arrangement 503 is supplied to a quantizer 507, e.g. a PWM quantizer as will be understood by one skilled in the art, to generate suitable PWM signals for controlling the output stage in the relevant switch states with a suitable duty-cycle to generate the output voltage.

In the example of FIG. 5 there may also be a limit block 507 implemented within the switching driver 101 which may be responsive to one or more current limits and limits of duty-cycle to provide limiting of the signal provided to the quantizer.

The modulator 106 illustrated in FIG. 5 could potentially clip in various ways. For instance, the integrator 504 and/or loop filter 506 could saturate, e.g. reach a limit of their operating range. In this case, the output of the integrator or filter may clip, e.g. become static, until such time as the relevant input to the integrator or filter changes sufficiently, e.g. due to changes in the input signal Sin'. As an additional or alternative source of clipping, the limit block 508 may respond to a limit of current or duty-cycle being reached and limit the input to the quantizer 507. The output of the limit block may thus be clipped, e.g. becomes static, until such time as the input changes due to changes in the input signal Sin'.

A clipping state of the integrator 504 and/or the loop filter 506 may be detected from monitoring operation of the integrator or filter, and detecting clipping of such components may, in some cases, be implemented in some conventional designs as will be understood by one skilled in the art. In embodiments of the present disclosure, however, an indication that the relevant component is clipping is provided to the voltage monitor 201, e.g. as an integrator clip indication INT CLP or a loop filter clip indication LF CLP. A clipping state of the limit block 508 may be flagged by the limit block, e.g. by an indication LIM flag. The voltage monitor 201 receives any such indication of clipping and can, in such cases, appropriately synthesise the indication SVmon of the output voltage as discussed with reference to FIG. 3.

It should be noted that FIG. 5 illustrates just one example of a suitable modulator and other implementations could have additional or alternative indicators of clipping.

In some implementations the issue of saturation of the integrators may be mitigated by using wrapping integrators, which rather than stopping at a given limit, instead reset and can continue to operate. For the analog integrator 504, the integrator may thus be configured to allow for a rapid reset, for instance to allow for charge on an integration capacitor to be rapidly reset as it reaches its limit, so as to then enable continued integration without any significant disruption. For the digital filter 506 a reset is straightforward to implement.

The embodiments of FIGS. 2 and 4 thus effectively use a first signal indicative of voltage demand of the switching driver 101 together with an indication of monitored operation of the switching driver, where the monitored operation is instances of clipping, to determine the output voltage from the switching driver, on the basis that the voltage demand, in normal non-clipped operation, defines the output voltage and when in a clipped state, the output voltage can be synthesised. Such embodiments can be seen as performing pseudo-sensing of the output voltage of interest by monitoring an upstream voltage demand and inferring the resultant output voltage. This can provide satisfactory monitoring of the output voltage that avoids the need for a dedicated AFE and ADC and which thus can be implemented with reduced size and costs and reduce power consumption, as well as avoiding the need for any associated trimming. The indication SVmon of output voltage can be used for various control purposes, and may for example, be provided to the DSP 107 for use, e.g. for transducer protection (possibly after some decimation to reduce the sample rate from that of the Sin' signal, which may be relatively high, e.g. due to interpolator 202). In some applications, however, it may also be desirable to detect a fault at the load and one possible way to detect some faults is by monitoring the voltage at the load. The pseudo-sensing approach which infers the voltage at the load would not be suitable for detecting such load faults.

Figure 6:
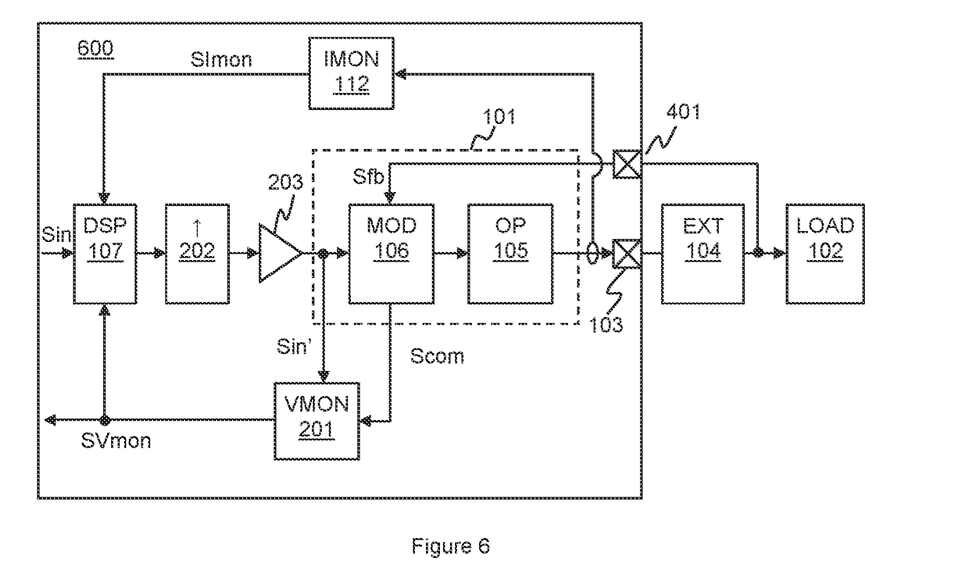
FIG. 6 illustrates a further example of a switching driver with output voltage monitoring according to an embodiment.

An alternative approach can be applied for a closed-loop modulator with feedback of the actual voltage from the load. In this case, the feedback signal Sfb for the modulator is indicative of the output voltage it is wished to monitor. A signal taken from a signal path of the switching driver 101 that includes a contribution from the feedback signal may thus be used as to provide monitoring of the output voltage. FIG. 6 illustrates one example of a driver apparatus 600 according to such an embodiment, in which similar components as discussed previously are identified by the same reference numerals.

FIG. 6 illustrates that the driver apparatus 600 comprises a switching driver 101 with a modulator 106 that receives a feedback signal Sfb which is obtained from an external, i.e. off-chip, monitoring point which is near to the load 102, in a similar manner as discussed with reference to FIG. 4. Within the modulator 106, the feedback signal Sfb is combined with the signal Sin' input to the switching driver and a signal, Scom, which is advantageously a digital signal, is tapped from a downstream point of the forward signal path of the modulator 106 and supplied to the voltage monitor 201, along with the digital signal Sin'.

The signal Scom is indicative of the signal Sin' input to the modulator 106 combined with the feedback signal, for instance the signal Scom may be indicative of the error between the feedback signal Sfb and the input Sin' to the modulator 106. The signal Scom thus effectively includes information about the actual output voltage of interest. The voltage monitor 201 is configured to receive the signals Sin' and Scom and to recover the actual output voltage and provide the indication SVmon of the output voltage.

Figure 7:
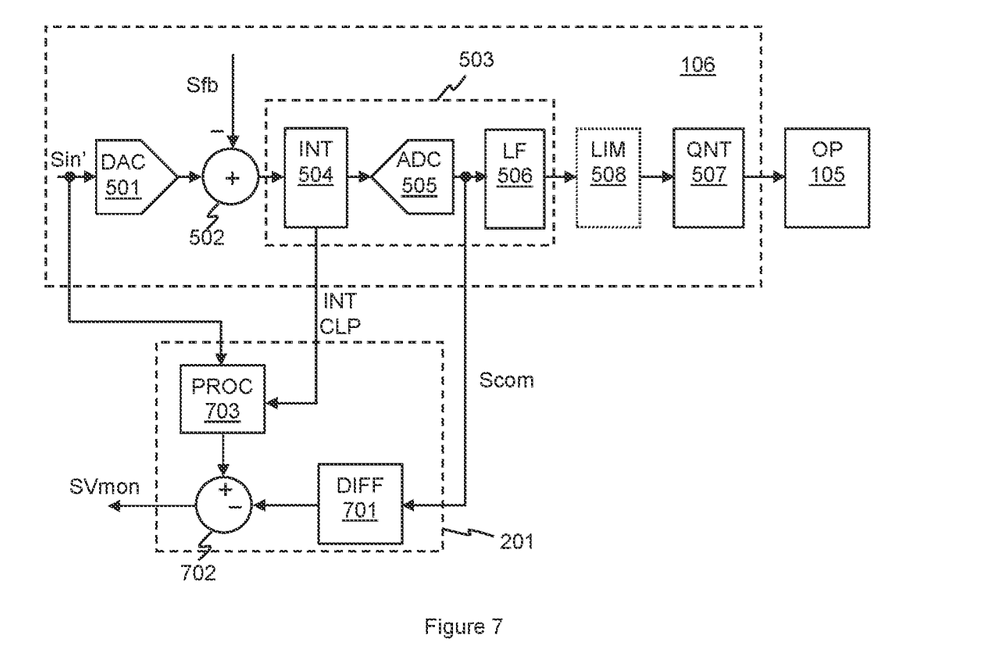
FIG. 7 illustrates an example of a modulator with voltage monitoring for use in the embodiment of FIG. 6.

FIG. 7 illustrates one example of a modulator 106 and voltage monitor 201 suitable for use in the embodiment of FIG. 6 in more detail. The modulator 106 in this example has the same general architecture as that discussed with reference to FIG. 5 and thus comprises a combiner 502 for combining the feedback signal with an analog version of the input Sin' provided from DAC 501 and a hybrid filter arrangement 503 for filtering the output of the combiner 502.

In the example of FIG. 7, the digital signal output from the ADC 505 of the hybrid filter arrangement 503 is tapped to provide the signal Scom. This signal is thus indicative of the integrated error between the signal Sin' and the feedback signal Sfb. This signal Scom is provided to the voltage monitor 201 which, in this example, comprises a differentiator 701 for differentiating the signal Scom so as to provide an indication of the error, which can be subtracted, by combiner 702, from the signal Sin'. The signal Sin' may be suitably delayed by processing block 703 to provide the correct phase alignment. This results in an indication of the feedback voltage, Sfb, which is the output voltage of interest, being recovered and output as the signal SVmon. Put another way, the digital version of the error signal Scom is used to adjust or correct the first digital signal Sin' based on the actual feedback so that the indication SVmon is an accurate representation of the monitored output voltage. This can be seen as a true-sensing approach, as opposed to the pseudo-sensing of the embodiments of FIGS. 2 and 4, as the indication SVmon is based on the monitored output voltage as represented by the feedback signal.

The voltage monitor 201 of the embodiment of FIG. 7 may also be configured to take clipping of the switching driver 101 into account. For instance, if the analog integrator 504 were to saturate, i.e. to enter a clipping state, the integrated error value and hence the value of the signal Scom may become static. If the signal Sin' were changing, the actual error between Sin' and Sfb could be increasing but this may not be reflected in the output of the differentiator 701 of the voltage monitor 201, and hence the correction applied to the digital signal Sin' to recover the actual output voltage may not be sufficient. In this case, the processor 703 may be responsive to an indication of clipping INT CLP to hold the value of Sin' at its previous value until the clipping is cleared in a similar fashion as discussed with reference to FIGS. 2 and 4. The static output from the differentiator 701 would be subtracted from this held value of Sin' to provide the indication SVmon of the output voltage until the clipping condition clears. It will be understood, however, that the use of wrapping integrators such as discussed above could avoid a problem with this integrator 504 clipping and avoid this problem. Note that in the embodiment of FIG. 6, limiting downstream of the tap point of the signal Scom, e.g. by limiter 508, may result in the output voltage being lower than expected for the modulator input Sin', but this will be reflected in the error between the feedback signal Sfb and the modulator input Sin'.

The example of FIG. 7 thus effectively makes use of the ADC 505 which is present in the modulator 503 to provide a digital signal (Scom in this example) which includes a contribution from the feedback signal and hence the monitored output voltage, and processes this digital signal (together with the first digital signal Sin') to recover the monitored output voltage. This allows the true sensing approach to be implemented without requiring a separate dedicated ADC for voltage monitoring. It will be noted that, typically, the ADC 505 of the hybrid filter arrangement 503 of such a modulator 106 would be implemented with an output resolution suitable for operation of the modulator and this output resolution may be lower than would typically be implemented for the ADC 111 of the conventional voltage monitoring circuitry 108 described with reference to FIG. 1. However, as the ADC 505 is within the control loop of the modulator 106, which provides noise shaping, the lower resolution provided by the ADC 505 will generally be sufficient to allow the output voltage to be recovered with sufficient accuracy and precision.

The embodiment illustrated in FIGS. 6 and 7 thus uses a first digital signal, in this case Sin', and applies a variable adjustment to the first digital signal based on monitored operation of the modulator 106, where the monitored operation comprises monitoring a second signal generated by the modulator 106 which includes contribution of the feedback signal and the modulator input Sin', i.e. is based on a combination of the modulator input signal Sin' and the feedback signal Sfb. Based on the first and second signals, any difference between the modulator input signal Sin' and the actual output voltage as represented by the feedback signal Sfb can be determined and used as part of the adjustment to the first digital signal to provide the indication of output voltage.

The embodiment of FIGS. 6 and 7 thus allows for generation of an indication SVmon which takes into account the feedback for the monitoring point near the load. The signal Svmon can thus be supplied to the DSP 107 for use, e.g. for transducer protection, in a similar manner as discussed with reference to FIGS. 2 and 4, but in addition the signal Svmon will contain information about the actual voltage at the load and hence can also be used to detect faults at the load. In addition, as the voltage monitor 201 of the embodiment of FIG. 7 receives a digital signal from the output of the integrator 504, the voltage monitor can also be used in debugging, e.g. when the switching driver is in a high-impedance state.

As discussed, in any of the embodiments discussed above the indication Svmon generated by the voltage monitor 201 may be used for some aspects of control and may, in particular be used for load characterisation and/or protection. For instance the signal Svmon may be supplied to the DSP 107 and used by at least one protection algorithm, e.g. possibly for temperature protection, which may also use an indication SImon of output current from current sensing circuitry 112.

Figure 8:
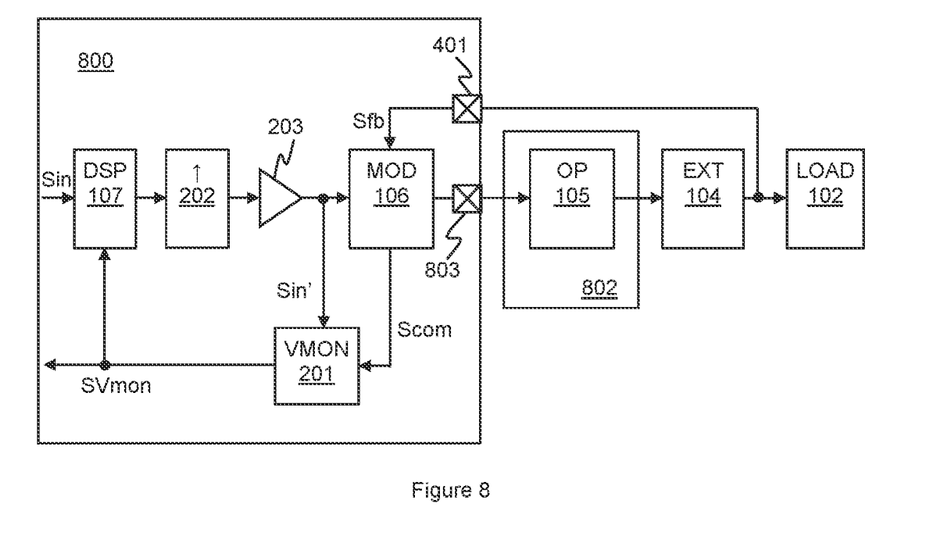
FIG. 8 illustrates an example of a drive circuit for driving a separate output stage, with voltage monitoring according to an embodiment.

The examples above have been discussed in the context of a voltage monitor 201 being implemented together with the switching driver 101, and thus implemented together, e.g. as an integrated circuit including the modulator 106 and the output stage 105. In some examples, however, the modulator 106 and output stage could be implemented separately, i.e. as separate integrated circuits or on separate chips. The modulator may thus be formed as part of a drive circuit for generating one or more control signals for controlling switching of the separate output or power stage. FIG. 8 illustrates one example of a drive circuit 800 similar to that discussed with reference to FIG. 6, but for use with a separate output stage. The drive circuit 800 comprises a modulator 106, optionally with upstream DSP, interpolator 202 and/or gain block 203 as discussed with reference to the other embodiments. However, the output stage 105 is implemented as part of a separate power stage 802. Such an arrangement may be beneficial, in some cases, in allowing separate optimization of the drive circuit 800 and the power stage 802. In use, the modulator 106 operates in the same way as discussed previously and generates at least one switch control signal for controlling switching of the output stage 105. The drive circuit 800 thus has output terminal(s) 803 for outputting the switch control signal(s) to the output stage. A feedback signal Sfb is received at the drive circuit 800 via terminal 401 in the same way as discussed previously and the voltage monitor 201 may operate in the same manner as previously described. The embodiments of FIGS. 2 and 4 could likewise be implemented with a separate output stage, but for the example of FIG. 2, where feedback is obtained from the output of the output stage 105, such a feedback signal would be obtained externally from the drive circuit.

The examples above have been discussed in the context of driving a transducer, which may in particular be an audio transducer, and embodiments of the present disclosure may advantageously be used in audio application or other applications for driving a transducer, e.g. such as haptic output transducer. However, the voltage monitoring may be applied to any application in which a switching driver is used to output an output voltage to a load based on an input signal.

The examples have been illustrated with monitoring of just one output voltage. For single ended applications that may be the case, but it will be understood that the driver apparatus may be implemented to drive a load in a BTL configuration and in this case voltage monitoring may be implemented for the differential voltage.

Embodiments may be implemented as an integrated circuit. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

The skilled person will recognise that some aspects of the above-described apparatus and methods, for instance processing of the various signals, may be embodied as processor control code, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112 (f) unless the words "means for" or "step for" are explicitly used in the particular claim.

The invention claimed is:

1. A circuit comprising:
a modulator configured to receive a modulator input signal and to generate at least one control signal based on the modulator input signal for controlling switching of an output stage of a switching driver to generate a first drive signal; and
a voltage monitor configured to generate an indication of output voltage of the first drive signal, wherein the voltage monitor is configured to receive a first digital signal tapped from the modulator and to generate said indication of output voltage of the first drive signal from the first digital signal by controllably applying an adjustment from the first digital signal to compensate for inaccuracy between the first digital signal and the output voltage, wherein said adjustment is based on monitored operation of the modulator.

2. The circuit of claim 1 wherein the first digital signal is the modulator input signal.

3. The circuit of claim 1 wherein the monitored operation comprises operation of the modulator in a clipping condition and wherein the modulator is configured to output at least one indication of clipping to the voltage monitor.

4. The circuit of claim 3 wherein operation of the modulator in a clipping condition comprises at least one of: clipping of an analog integrator of the modulator, clipping of a digital filter of the modulator; current limiting of an input current to the output stage being applied; current limiting of an output current from the output stage being applied; and a limit of duty-cycle of the output stage being applied.

5. The circuit of claim 3 wherein the voltage monitor is configured:

to use the first digital signal to provide the indication of output voltage of the first drive signal when the switching driver is not operating in a clipping condition; and
to generate a synthesised signal to provide the indication of output voltage of the first drive signal when the switching driver is not operating in a clipping condition.

6. The circuit of claim 5 wherein the voltage monitor is configured to generate the synthesised signal by holding a value of the first digital signal from a time at which the indication of clipping is received.

7. The circuit of claim 1 wherein the modulator is a closed-loop modulator configured to receive a feedback signal from a first driver output node of the output stage and the indication of output voltage of the first drive signal generated by the voltage monitor is an indication of output voltage at the first driver output node.

8. The circuit of claim 1 wherein the modulator is a closed-loop modulator configured to receive a feedback signal from a first driver output node of the output stage and wherein the voltage monitor is configured to process the first digital signal according to a defined transfer characteristic for a downstream path from the first driver output node to a load such that the indication of output voltage of the first drive signal generated by the voltage monitor is an indication of output voltage at the load.

9. The circuit of claim 1 wherein the modulator is a closed-loop modulator configured to receive a feedback signal from a monitoring point of a downstream path from the output stage to a load and the indication of output voltage of the first drive signal generated by the voltage monitor is an indication of output voltage at the monitoring point.

10. The circuit of claim 9 wherein said monitored operation of the modulator comprises monitoring a second signal generated by the modulator which includes a contribution from the modulator input signal and a contribution from the feedback signal.

11. The circuit of claim 10 wherein the voltage monitor is configured to receive said second signal and voltage monitor is configured to use the second signal to process the first digital signal to recover the feedback signal.

12. The circuit of claim 11 wherein the second signal is a digital signal.

13. The circuit of claim 12 wherein the modulator comprises:
a digital-to-analog converter for receiving the modulator input signal and converting it to analog;
a combiner for combining the analog modulator input signal with the feedback signal; and
a filter arrangement configured to receive the analog output from the combiner, apply filtering and output a filtered digital signal, wherein the filter arrangement comprises a analogue-to-digital converter;
wherein the second signal is tapped from the output of the analogue-to-digital converter.

14. The circuit of claim 13 wherein the filter arrangement comprises an analogue integrator between the combiner and the analogue-to-digital converter and the voltage monitor is configured to receive and differentiate the second signal and combine the differentiated second signal with the first signal to provide the indication of output voltage of the first drive signal.

15. The circuit of claim 1 wherein the modulator comprises at least one of: an analogue integrator configured as a wrapping integrator; and a digital integrator configured as a wrapping integrator.

16. The circuit of claim 1 further comprising digital processing circuitry upstream of the switching driver configured to provide the modulator input signal to the modulator wherein the digital processing circuitry is configured to receive the indication of output voltage of the first drive signal from the voltage monitor for use in at least one control process.

17. The circuit of claim 16 wherein the digital processing circuitry is configured to receive the indication of output voltage of the first drive signal and to use it, together with an indication of output current from the output stage, for thermal protection of a load driven by the first drive signal.

18. A driver apparatus for driving a load comprising:
a switching driver comprising an output stage configured to switch a first driver output node between different switching voltages to generate a first drive signal for driving the load at the first driver output node;
and a modulator configured to receive a modulator input signal and to control switching of the output stage based on the modulator input signal; and
a voltage monitor configured to generate an indication of output voltage of the first drive signal, wherein the voltage monitor is configured to receive a first digital signal indicative of the modulator input signal and a second digital signal indicative of modulator operation and to adjust the first digital signal based on the second digital signal to generate said indication of output voltage of the first drive signal.

19. A circuit comprising:
a modulator configured to receive a modulator input signal and to generate at least one control signal based on the modulator input signal for controlling switching of an output stage of a switching driver to generate a first drive signal; and
a voltage monitor configured to generate an indication of output voltage of the first drive signal, wherein the voltage monitor is configured to receive a first digital signal indicative of the modulator input signal and an indication of clipping of the modulator and:
to use the first digital signal to provide the indication of output voltage of the first drive signal when the switching driver is not clipping; and
to generate a synthesised signal to provide the indication of output voltage of the first drive signal when the switching driver is clipping.

20. A circuit comprising:
a modulator configured to receive a modulator input signal and to generate at least one control signal based on the modulator input signal for controlling switching of an output stage of a switching driver to generate a first drive signal, wherein the modulator is a closed-loop modulator configured to receive a feedback signal from a monitoring point of a downstream path from the output stage to the load; and
a voltage monitor configured to generate an indication of output voltage of the first drive signal, wherein the voltage monitor is configured to receive a first digital signal indicative of the modulator input signal and a second digital signal indicative of the modulator input signal combined with the feedback signal and to process the first and second digital signals to provide an indication of the feedback signal to provide said indication of output voltage of the first drive signal.

* * * * *